United States Patent
Van Damme et al.

(10) Patent No.: US 6,489,078 B1
(45) Date of Patent: Dec. 3, 2002

(54) IR RADIATION-SENSITIVE IMAGING ELEMENT AND A METHOD FOR PRODUCING LITHOGRAPHIC PLATES THEREWITH

(75) Inventors: Marc Van Damme, Heverlee (BE); Joan Vermeersch, Deinze (BE); Hendrikx Peter, Hamont-Achel (BE)

(73) Assignee: Agfa-Gevaert, Mortsel (BE)

( * ) Notice: Subject to any disclaimer, the term of this patent is extended or adjusted under 35 U.S.C. 154(b) by 672 days.

(21) Appl. No.: 08/889,444

(22) Filed: Jul. 8, 1997

Related U.S. Application Data

(60) Provisional application No. 60/026,552, filed on Sep. 23, 1996.

(30) Foreign Application Priority Data

Jul. 19, 1996 (EP) .............................................. 96202052

(51) Int. Cl.[7] .......................... G03F 7/016; G03F 7/039
(52) U.S. Cl. .................... 430/170; 430/171; 430/270.1; 430/278.1; 430/302; 430/348; 430/944; 430/945; 430/964
(58) Field of Search ................................. 430/157, 159, 430/278.1, 271.1, 270.1, 302, 348, 944, 945, 964, 170, 171

(56) References Cited

U.S. PATENT DOCUMENTS

| | | | | |
|---|---|---|---|---|
| 5,008,175 A | * | 4/1991 | Hsieh et al. ................ | 430/155 |
| 5,212,046 A | * | 5/1993 | Lamola et al. ............... | 430/270 |
| 5,466,557 A | * | 11/1995 | Haley et al. ................. | 430/278 |
| 5,658,708 A | * | 8/1997 | Kondo ..................... | 430/288.1 |
| 5,705,309 A | * | 1/1998 | West et al. .................. | 430/167 |
| 5,919,601 A | * | 7/1999 | Nguyen et al. ........... | 430/278.1 |
| 6,083,658 A | * | 7/2000 | Kunita et al. ............ | 430/270.1 |
| 6,140,022 A | * | 10/2000 | Van Damme et al. ...... | 430/302 |
| 6,340,815 B1 | * | 1/2002 | Verschueren et al. ....... | 250/318 |
| 6,410,208 B1 | * | 6/2002 | Teng .......................... | 430/302 |
| 2001/0041305 A1 | * | 11/2001 | Sawada et al. .......... | 430/278.1 |
| 2002/0061460 A1 | * | 5/2002 | Eichhorn et al. ........ | 430/270.1 |
| 2002/0086238 A1 | * | 7/2002 | Fujimaki et al. ......... | 430/281.1 |

FOREIGN PATENT DOCUMENTS

EP 819 985 A1 * 1/1998 ............. G03F/7/04

* cited by examiner

*Primary Examiner*—Janet Baxter
*Assistant Examiner*—Barbara Gilliam
(74) *Attorney, Agent, or Firm*—Breiner & Breiner, L.L.C.

(57) ABSTRACT

According to the present invention there is provided an IR radiation-sensitive imaging element comprising on a hydrophilic surface of a lithographic base an image forming layer comprising (1) a water insoluble, alkali soluble or swellable resin having a phenolic hydroxy group, (2) a latent Bronsted acid, and (3) an amino crosslinking agent capable of reacting with the water insoluble, alkali soluble or swellable resin under the influence of an acid, characterized in that said image forming layer comprises a carbon black pigment as infrared absorber.

9 Claims, No Drawings

IR RADIATION-SENSITIVE IMAGING ELEMENT AND A METHOD FOR PRODUCING LITHOGRAPHIC PLATES THEREWITH

This application claims the benefit of U.S. Provisional Application No. 60/026,552 filed Sep. 23, 1996.

1. FIELD OF THE INVENTION

The present invention relates to a radiation sensitive material for making a lithographic printing plate. The present invention further relates to a method for preparing a printing plate from said radiation sensitive material.

2. BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of such light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat sensitive rather than photosensitive. A particular disadvantage of photosensitive imaging elements such as described above for making a printing plate is that they have to be shielded from the light. Furthermore they are less suited for computer-to-plate imaging. The trend towards heat sensitive printing plate precursors is clearly seen on the market.

For example, EP-A 952022871.0, 952022872.8, 952022873.6 and 952022874.4 disclose a method for making a lithographic printing plate comprising the steps of (1) image-wise exposing to light a heat sensitive imaging element comprising (i) on a hydrophilic surface of a lithographic base an image forming layer comprising hydrophobic thermoplastic polymer particles dispersed in a hydrophilic binder and (ii) a compound capable of converting light to heat, said compound being comprised in said image forming layer or a layer adjacent thereto; (2) and developing a thus obtained image-wise exposed element by rinsing it with plain water.

EP-A 625728 discloses a lithographic plate with an image forming layer which is UV- and IR-sensitive which can be as well positive as negative working. Said image forming layer comprises (1) a resole resin, (2) a novolac resin, (3) a latent Bronsted acid and (4) an IR absorber. By exposing with UV or IR (830 nm) light followed by a baking (60 seconds at 100° C.) before the development step a negative working printing plate is obtained. The method for obtaining a positive working plate is not disclosed.

U.S. Pat. No. 4,708,925 discloses a positive working printing plate comprising a light sensitive composition comprising (1) an alkalisoluble novolac resin and an onium-salt and optionally an IR spectral sensitizing dye. By exposing with UV, visible or IR light followed by a development step with an alkali solution there is obtained a positive working printing plate. Said plate is sensitive to room handling.

3. SUMMARY OF THE INVENTION

It is an object of the present invention to provide an imaging element being infrared light and heat sensitive to facilitate digital imaging by exposure to infrared radiation or a thermal printing head.

It is a further object of the present invention to provide an imaging element being insensitive to visible radiation so as to facilitate room-light handling.

It is another object of the present invention to provide a method for obtaining in a convenient way a positive working lithographic printing plate of a high quality using said imaging element.

Further objects of the present invention will become clear from the description hereinafter.

According to the present invention there is provided an IR radiation-sensitive imaging element comprising on a hydrophilic surface of a lithographic base an image forming layer comprising (1) a water insoluble, alkali soluble or swellable resin having a phenolic hydroxy group, (2) a latent Bronsted acid, and (3) a crosslinking agent capable of reacting with the water insoluble, alkali soluble or swellable resin under the influence of an acid, characterized in that said image forming layer comprises a carbon black pigment as infrared absorber.

According to the present invention there is also provided a method for obtaining a positive working lithographic printing plate comprising the steps of:

(a) image-wise or information-wise exposing to IR light or heat an imaging element as described above;

(b) heating said exposed imaging element to provide reduced solubility in the unexposed areas;

(c) developing said exposed and heated imaging element with an aqueous alkaline developing solution in order to remove the exposed areas and thereby form a lithographic printing plate.

4. DETAILED DESCRIPTION OF THE INVENTION

It has been found that imaging elements which are recordable with UV and IR radiation and heat and which yield lithographic printing plates of high quality can be obtained according to the method of the present invention using an imaging element as described above.

To utilize it as a positive working plate requires the steps of imagewise exposure to activating radiation, heating of the plate to provide reduced solubility in unexposed areas and contact with an aqueous alkaline processing solution to remove the exposed areas. The use of both a water insoluble, alkali soluble or swellable resin having a phenolic hydroxy group and a crosslinking agent is essential.

While applicants do not wish to be bound by any theoretical explanation for the manner in which their invention functions, it is believed that it is based upon an acid-catalyzed chemical amplification mechanism which occurs upon heating of the unexposed areas of the plate. This mechanism reduces the solubility of the unexposed areas by hardening the mixture of resins.

In the exposed areas the mechanism is not fully understood. An unknown interaction of the acid being formed as a result of the infrared light exposure with the carbon black is suggested.

The functioning of the plate as a positive working plate is critically dependent upon the use of a mixture of a crosslinking agent and a water insoluble, alkali soluble or swellable resin having a phenolic hydroxy group since the use of either compound alone does not provide a useful developed image.

The carbon black pigment renders the composition sensitive to infrared radiation and makes the printing plate useful as a direct laser addressable plate which can be imaged by exposure to a laser which emits in the infrared region. As carbon black pigment all common types can be used which absorb in the infrared wavelength region. The carbon pigment may be as well in the amorphous as in the cristalline state. Preferably the number average diameter of the carbon black pigment ranges from 0.01 to 1 µm, more preferably from 0.1 to 0.5 µm. Examples of commercially available carbon black pigments are CORAX L6, FARBRUSS FW 200, SPECIALSCHWARZ 4A, SPECIALSCHWARZ 250 and PRINTEX U.

Suitable crosslinking agents according to the invention are melamine-phenol-formaldehyde resins, phenol-formaldehyde resins and resole resins. These resins are commercially available from Occidental Chemical Corporation and Ashland-Sud Chemie, Gmbh.

More preferred are amino crosslinking agents. An amino crosslinking agent according to the invention is a compound obtainable by the condensation of an amino group containing substance and formaldehyde. Said amino crosslinking agent has paired functional groups attached to the amino nitrogens. The three, most common paired groups may be represented as follows

—N(CH$_2$OR)$_2$, —N(CH$_2$OH)CH$_2$OR , —N(H)CH$_2$OR where R is generally a low molecular weight alkyl group such as methyl, ethyl, butyl or isobutyl.

Most preferably said amino crosslinking agent is a compound selected from the group consisting of melamine-formaldehyde resins, (thio)urea-formaldehyde resins, guanamine-formaldehyde resins, benzoguanamine-formaldehyde resins and glycoluril-formaldehyde resins. Some of said compounds are comercially available under the registered trade marks CYMEL or DYNOMIN from Dyno Cyanamid and NIKALAC from Sanwa Chemical Co, Ltd.

Suitable resins having phenolic hydroxy groups for use in an image forming layer in connection with this invention are for example synthetic novolac resins such as ALNOVOL, a registered trade mark of Reichold Hoechst and DUREZ, a registered trade mark of OxyChem, synthetic polyvinylfenols such as MARUKA LYNCUR M, a registered trade mark of Dyno Cyanamid and phenolic hydroxy functionalized derivatives of poly(meth)acrylates, which can be synthesized starting from e.g. hydroxyethyl(meth)acrylate.

The fourth essential ingredient of the radiation-sensitive composition of this invention is a latent Bronsted acid. The term "latent Bronsted acid" refers to a precursor which forms a Bronsted acid by decomposition. The Bronsted acid is believed to catalyze the matrix-forming reaction between the crosslinking agent and the resin having phenolic hydroxy groups. Typical examples of Bronsted acids which are suitable for this purpose are sulphonic acids e.g. trifluoromethane sulphonic acid and hexafluorophosphoric acid.

Ionic latent Bronsted acids are suitable for use in this invention. Examples of these include onium salts, in particular iodonium, sulfonium, phosphonium, selenonium, diazonium and arsonium salts.

Useful ionic latent Bronsted acids include those represented by the formula:

$$X^+R_1R_2R_3R_4 \ W^-$$

When X is iodine then $R_3$ and $R_4$ are electron lone pairs and $R_1$ and $R_2$ each independently are aryl or substituted aryl groups. When X is S or Se then $R_4$ is an electron lone pair and $R_1$, $R_2$ and $R_3$ each independently can be an aryl group, a substituted aryl group, an aliphatic group or a substituted aliphatic group. When X is P or As, then $R_1$, $R_2$, $R_3$ and $R_4$ each independently can be an aryl group, a substituted aryl group, an aliphatic group or a substituted aliphatic group. W can be $BF_4$, $CF_3SO_3$, $SbF_6$, $CCl_3CO_2$, $ClO_4$, $AsF_6$, $PF_6$, or any corresponding acid whose pH is less than three.

Any of the onium salts described in U.S. Pat. No. 4,708,925 can be utilized as the latent Bronsted acid in this invention. These include iodonium, sulfonium, phosphonium, bromonium, chloronium, oxysulfoxonium, oxysulfonium, sulfoxonium, selenonium, telluronium and arsonium salts.

Use of diazonium salts as latent Bronsted acids is particularly preferred in this invention.

Specific examples of particularly useful onium salts include:

diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate Non-ionic latent Bronsted acids are also suitable for use in this invention. Examples of these include compounds of the formula:

$$RCH_2X, \ RCHX_2, \ RCX_3, \ R(CH_2X)_2 \ and \ R(CH_2X)_3$$

wherein X is Cl, Br, F, or $CF_3SO_3$ and R is an aromatic group or an aliphatic group.

Further suitable non-ionic latent Bronsted acids are haloalkyl-substituted s-triazines as disclosed in EP-A 672954, o-quinone diazides, photo acid generating agents having an o-nitrobenzyl type protective group as described in *Polymer Sci.*, by S. Hayase et al, 25, 573 (1987); the compounds which are subjected to a photodecomposition to generate a sulfonic acid, represented by iminosulfonates as described in *Polymer Preprints* Japan, by M. Tunooka et al, 35 (8), by disulfon compounds described in JP-Pi 61-166544, by α-sulphonyloxy ketones, by α-hydroxymethylbenzoine sulphonates, by nitrobenzyl sulphonates, by α-sulphonyl acetophenones and by sulphonyl imides, the preparation of these last compounds being well known in the literature; the compounds which are subjected to a photodecomposition to generate a phosphonic acid, a partly esterified phosphoric acid or phosphoric acid, represented by nitrobenzylphosphates or phosphonates as described in *Tetrahedron Letters*, by M. Rubinstein et al., 17, 1445 (1975), by benzoine phosphates or phosphonates, as described in *J. Org. Chem.* by M. Pirrung and S. Shuey, 59

3890 (1994), by pyrenemethylphosphates or phosphonates, by iminophosphates or phosphonates and by imidophosphates or phosphonates, the preparation of these last compounds being well known in the literature.

Further, compounds in which the above photosensitive acid precursors are introduced into a primary chain or a side chain of a polymer can be used. Examples thereof include the compounds described in e.g. *J.Am.Chem.Soc.*, by M. E. Woodhouse et al, 104, 5586 (1982); *J.Imaging Sci.*, by S. P. Pappas et al, 30 (5), 218 (1986); etc..

As explained hereinabove, the four essential ingredients of the radiation-sensitive composition of this invention are a crosslinking agent, a resin having phenolic hydroxy groups, a latent Bronsted acid and a carbon black pigment. Other ingredients which can optionally be incorporated in the composition include colorants, stabilizers, additional sensitizers, exposure indicators and surfactants.

The thickness of the image forming layer in the printing plates of this invention can vary widely. Typically, a dry thickness in the range of from 0.25 to 10 micrometers, more preferably from 0.75 to 5 micrometers is suitable.

To form the radiation sensitive imaging element, the crosslinking agent, the resin having phenolic hydroxy groups, the latent Bronsted acid and the carbon black pigment are dissolved or dispersed in a suitable solvent in appropriate proportions and coated on the support using such well-known coating techniques as spin coating or hopper coating. Preferred solvents include acetone, methylethylketone and 1-methoxy-2-propanol.

The crosslinking agent is preferably incorporated in the coating composition in an amount of from 0.5 to 10 percent by weight, more preferably from 1 to 6 percent by weight, and most preferably from 1.5 to 4.0 percent by weight.

The resin having phenolic hydroxy groups is preferably incorporated in the coating composition in an amount of from 1.0 to 20 percent by weight, more preferably from 3.5 to 9 percent by weight, and most preferably from 5.0 to 7.5 percent by weight.

The latent Bronsted acid is preferably incorporated in the coating composition in an amount of from 0.1 to 2 percent by weight, more preferably from 0.25 to 0.9 percent by weight, and most preferably from 0.35 to 0.70 percent by weight.

The carbon black pigment is preferably incorporated in the coating composition in an amount of from 0.1 to 5.0 percent by weight, more preferably from 0.5 to 3.5 percent by weight, and most preferably from 1.0 to 2.5 percent by weight.

Suitable conditions for drying the layer involve heating for a period of from 0.5 to 10 minutes at a temperature in the range of from 20° C. to 150° C.

According to one embodiment of the present invention, the lithographic base can be an anodised aluminum support. A particularly preferred lithographic base is an electrochemically grained and anodized aluminum support. According to the present invention, an anodized aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. An interesting treatment involves treating the aluminum oxide surface with polyvinyl phosphonic acid as disclosed in DE-OS 2,607,207. A further interesting treatment involves rinsing the aluminum oxide surface with a bicarbonate solution. It is further evident that one or more of these post treatments may be carried out alone or in combination.

According to another embodiment in connection with the present invention, the lithographic base comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As flexible support of a lithographic base in connection with the present embodiment it is particularly preferred to use a plastic film e.g. substrated polyethylene terephthalate film, cellulose acetate film, polystyrene film, polycarbonate film etc. The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is between 200 mg per m² and 750 mg per m². Further, the ratio of silica to hydrophilic binder is preferably more than 1 and the surface area of the colloidal silica is preferably at least 300 m² per gram, more preferably at least 500 m² per gram.

The lithographic printing plates of this invention can be exposed with a laser diode which emits radiation in the near-infrared region of the spectrum. Such laser diodes provide the advantage of both low cost and low energy consumption.

A particularly suitable exposing device is a laser or laser diode with a maximum output between 750 and 1500 nanometers. Such a device is typically capable of decomposing the latent Bronsted acid in the exposed areas and thereby rendering it by heating ineffective for crosslinking. The products from the decomposition of the latent Bronsted acid by heating are mainly strong acids which are effective in crosslinking the resins in the unexposed areas, thereby altering the solubility in aqueous alkaline developing solution.

As described hereinabove, the imagewise-exposed plate is heated in a step that is referred to as a post-exposure bake or PEB. The heating step is conducted at a temperature which is high enough to induce thermal crosslinking in the non-exposed areas. This temperature depends on the thermal stability of the latent Bronsted acid and the nature of the water insoluble, alkali soluble or swellable resin having a phenolic hydroxy group and the nature of the crosslinking agents. Typically this temperature is in the range of from 70° C. to 200° C. for a period of from 15 to 300 seconds. More preferably, the heating is for a period of from 30 to 90 seconds at a temperature in the range of from 80° C. to 150° C. After the PEB is completed, the plate is then either hand processed or machine processed in an aqueous alkaline developing solution until the exposed areas are removed. This typically requires 30 to 120 seconds. A preferred aqueous alkaline developing solution is a silicate solution such as a six percent by weight aqueous solution of sodium meta-silicate. A suitable commercially available silicate solution for this purpose is KODAK AQUA-IMAGE POSITIVE DEVELOPER MX-1406-1 which is sold by Eastman Kodak Company or Fuji PS-plate developer DP-5 which is sold by Fuji Company. After contact with the aqueous alkaline developing solution, the plate is usually treated with a finisher such as gum arabic.

The number of printing impressions obtainable is primarily dependent upon use of a post development baking step. If no such baking step is used, the plate typically provides 60000 to 70000 impressions, whereas post development baking for 5 minutes at 250° C. typically provides 300000 to 350000 impressions. The number of impressions that can be attained before wear is detected can also be increased by increasing the coating weight.

Since the printing plate of this invention is infrared light sensitive, digital imaging information can be conveniently utilized to form continuous or halftone images using a suitable source of infrared radiation such as a laser diode emitting in the infrared region.

The following examples illustrate the present invention without however, limiting it thereto. All parts, percentages and ratios are by weight unless otherwise indicated.

EXAMPLE 1

Preparation of the Lithographic Base

A 0.20 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m² to form a surface topography with an average center-line roughness Ra of 0.5 $\mu$m.

After rinsing with demineralized water the aluminum foil was then etched with an aqueous solution containing 300 g/l of sulfuric acid at 60° C. for 180 seconds and rinsed with demineralized at 25° C. for 30 seconds.

The foil was subsequently subjected to anodic oxidation in an aqueous solution containing 200 g/l of sulfuric acid at a temperature of 45° C., a voltage of about 10 V and a current density of 150 A/m² for about 300 seconds to form an anodic oxidation film of 3.00 g/m² of $Al_2O_3$, then washed with demineralized water, posttreated with a solution containing 20 g/l of sodium bicarbonate at 40° C. for 30 seconds, subsequently rinsed with demineralized water at 20° C. during 120 seconds and dried.

Preparation of the carbon black dispersion CBD-1

A carbon black dispersion was prepared by dissolving 20 g of MARUKA LYNCUR M H-2 (a homopolymer of polyvinylphenol from Maruzen Co) in 80 g of methylethylketone in a ball mill and adding 13.33 g of CORAX L6 (carbon black pigment of Degussa) and 0.5 g of SOL-SPERSE 24000 GR (dispersing aid from Zeneca Resins). After 72 hours milling the dispersion was ready for use.

Preparation of the Imaging Element

The IR-sensitive layer was coated on the lithographic aluminum base from a 10% w/w solution of 90% w/w methyl ethyl ketone and 10% w/w methanol with a wet layer thickness of 20 $\mu$m. The resulting dry IR-sensitive layer had the following composition : 62% w/w MARUKA LYNCUR M H-2 ( homopolymer of polyvinylphenol from Maruzen Co), 19% w/w CYMEL 303 (hexamethoxymethyl melamine from Dyno Cyanamid), 5% w/w TRIAZINE S (2,4,6-(trichloromethyl)-s-triazine from P.C.A.S.) and 14% w/w of carbon black pigment Preparation of the Printing Plate The IR-sensitive imaging element was subjected to a scanning NdYlf laser emitting at 1050 nm (scanspeed 1.1 m/s, spot size 15 $\mu$m and the power on plate surface was varied from 75 to 420 mW ). After imaging the plate was heated in an oven for 150 seconds at 125° C. and cooled to room temperature. The imaging element was then processed with Fuji PS-plate developer DP-5 to remove the exposed areas resulting in a positive working lithographic printing plate. The obtained image on the lithographic base could be used to print on a conventional offset press using a commonly employed ink and fountain. Excellent copies were obtained.

EXAMPLE 3

A lithographic printing plate was prepared in an identical way as the lithographic printing plate of example 1 except that the imaging element was subjected to a scanning NdYAG laser emitting at 1064 nm (scanspeed 100 m/s, spot size 14 $\mu$m and the power on plate surface was varied from 1 to 4 mW ). Results similar to those described in example 1 were achieved.

What is claimed is:

1. An IR radiation-sensitive imaging element comprising on a hydrophilic surface of a lithographic base an image forming layer including (1) a water insoluble, alkali soluble or swellable resin having a phenolic hydroxy group, (2) a latent Bronsted acid, and (3) an amino crosslinking agent capable of reacting with the water insoluble, alkali soluble or swellable resin under the influence of an acid, characterized in that said image forming layer comprises a carbon black pigment as infrared absorber.

2. An IR radiation sensitive imaging element according to claim 1 wherein said amino crosslinking agent is a compound selected from the group consisting of melamine-formaldehyde resins, (thio)ureaformaldehyde resins, guanamine-formaldehyde resins, benzoguanamine formaldehyde resins and glycoluril-formaldehyde resins.

3. An IR radiation sensitive imaging element according to claim 1 wherein said water insoluble, alkali soluble or swellable resin having phenolic hydroxy groups is a novolac resin, a phenolic hydroxy functionalized poly(meth)acrylate or a polyvinylphenol resin.

4. An IR radiation sensitive imaging element according to claim 1 wherein said latent Bronsted acid is an ionic latent Bronsted acid.

5. An IR radiation sensitive imaging element according to claim 4 wherein said ionic latent Bronsted acid is an iodonium, sulphonium, selononium, diazonium or arsonium salt.

6. An IR radiation sensitive imaging element according to claim 1 wherein said latent Bronsted acid is a non-ionic latent Bronsted acid.

7. An IR radiation sensitive imaging element according to claim 6 wherein said non-ionic latent Bronsted acid is a haloalkyl-substituted s-triazine.

8. An IR radiation sensitive imaging element according to claim 1 wherein said lithographic base is anodized aluminum or comprises a flexible support having thereon a cross-linked hydrophilic layer.

9. A method for obtaining a negative working lithographic printing plate comprising the steps of:

(a) image-wise or information-wise exposing to IR light or heat an imaging element according to claim 1;

(b) heating said exposed imaging element to provide reduced solubility in the unexposed areas;

(c) developing said exposed and heated imaging element with an aqueous alkaline developing solution in order to remove the exposed areas and thereby form a lithographic printing plate.

* * * * *